United States Patent
Sato

(10) Patent No.: US 9,172,237 B2
(45) Date of Patent: Oct. 27, 2015

(54) SEMICONDUCTOR INTEGRATED CIRCUIT

(75) Inventor: Takehisa Sato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 655 days.

(21) Appl. No.: 13/471,638

(22) Filed: May 15, 2012

(65) Prior Publication Data
US 2012/0293893 A1 Nov. 22, 2012

(30) Foreign Application Priority Data
May 19, 2011 (JP) ................................. 2011-112139

(51) Int. Cl.
*H02M 1/32* (2007.01)
*H02H 5/04* (2006.01)
*H03K 17/08* (2006.01)
*H01L 27/12* (2006.01)
*H02M 3/156* (2006.01)

(52) U.S. Cl.
CPC ............ *H02H 5/044* (2013.01); *H01L 27/1225* (2013.01); *H02M 3/156* (2013.01); *H02M 2001/327* (2013.01); *H03K 2017/0806* (2013.01)

(58) Field of Classification Search
CPC ............. H02H 5/04; H02H 5/44; H02H 7/10; H02H 5/044; H03K 2017/0806; H02M 2001/327; H02M 3/156
See application file for complete search history.

(56) References Cited

U.S. PATENT DOCUMENTS

| | | | |
|---|---|---|---|
| 4,769,753 A | 9/1988 | Knudson et al. | |
| 4,914,375 A | 4/1990 | Hatanaka | |
| 5,426,375 A * | 6/1995 | Roy et al. ................. | 324/762.03 |
| 5,434,443 A * | 7/1995 | Kelly et al. .................... | 257/467 |
| 5,727,193 A | 3/1998 | Takeuchi | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,724,156 B2 | 4/2004 | Fregoso | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Zeev V Kitov
(74) *Attorney, Agent, or Firm* — Fish & Richardson P.C.

(57) ABSTRACT

A power source circuit includes a voltage converter circuit and a control circuit that includes a voltage divider circuit and a protective circuit. The protective circuit includes a first oxide semiconductor transistor in which an off-state current is increased as temperature is increased, a capacitor that accumulates the off-state current as electric charge, a second oxide semiconductor transistor, and an operational amplifier including a non-inverting input terminal to which a reference voltage is input. The first oxide semiconductor transistor is provided near the voltage converter circuit or an element that generates heat in the control circuit.

29 Claims, 12 Drawing Sheets

(56) References Cited

U.S. PATENT DOCUMENTS

| | | | |
|---|---|---|---|
| 6,727,522 | B1 | 4/2004 | Kawasaki et al. |
| 6,940,482 | B2 | 9/2005 | Ishii et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0060560 | A1 | 5/2002 | Umemoto |
| 2002/0132454 | A1 | 9/2002 | Ohtsu et al. |
| 2002/0185994 | A1 | 12/2002 | Kanouda et al. |
| 2003/0043090 | A1 | 3/2003 | Yazawa et al. |
| 2003/0160744 | A1 | 8/2003 | Yoshida et al. |
| 2003/0189401 | A1 | 10/2003 | Kido et al. |
| 2003/0197494 | A1 | 10/2003 | Kanouda et al. |
| 2003/0218222 | A1 | 11/2003 | Wager, III et al. |
| 2004/0038446 | A1 | 2/2004 | Takeda et al. |
| 2004/0080501 | A1 | 4/2004 | Koyama |
| 2004/0127038 | A1 | 7/2004 | Carcia et al. |
| 2005/0012698 | A1 | 1/2005 | Takahashi |
| 2005/0017302 | A1 | 1/2005 | Hoffman |
| 2005/0110719 | A1 | 5/2005 | Satoh et al. |
| 2005/0116655 | A1 | 6/2005 | Yazawa |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0029977 | A1 | 2/2007 | Asada |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0009505 | A1 | 1/2009 | Koyama |
| 2009/0068773 | A1 | 3/2009 | Lai et al. |
| 2009/0073325 | A1 | 3/2009 | Kuwabara et al. |
| 2009/0080222 | A1* | 3/2009 | Popescu et al. .................. 363/20 |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0273325 | A1* | 11/2009 | Nakahashi et al. ........... 323/282 |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0254523 | A1 | 10/2011 | Ito et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-066006 A | 3/1996 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-096699 A | 5/2011 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar

(56) References Cited

OTHER PUBLICATIONS

Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium—Gallium—Zinc Oxide TFTS and Their Application for Large Size AMOLED," AM-FPD '08 Digest of Technical Papers, Jul. 2, 2008, pp. 275-278.
Park, S et al., "Challenge to Future Displays: Transparent AM-Oled Driven by Peald Grown ZnO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-IN. AMOLED Display With Driver Circuit Using Amorphous In—Ga—Zn—Oxide TFTs," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous Gizo (Ga2O3—In2O3—ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.
Costello, M et al., "Electron Microscopy of a Cholesteric Liquid Crystal and its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N. et al., "Spinel,YBFe2O4, and YB2Fe3O7 Types of Structures for Compounds in the IN2O3 and Sc2O3—A2O3—BO

(56) References Cited

OTHER PUBLICATIONS

Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N. et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$—$ZnGa_2O_4$—$ZnO$ System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds $InMO_3(ZnO)m$ (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the $In_2O_3$—$Ga_2ZnO_4$—$ZnO$ system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline $InGaO_3(ZnO)_5$ films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

* cited by examiner

FIG. 8A
FIG. 8B
FIG. 8C
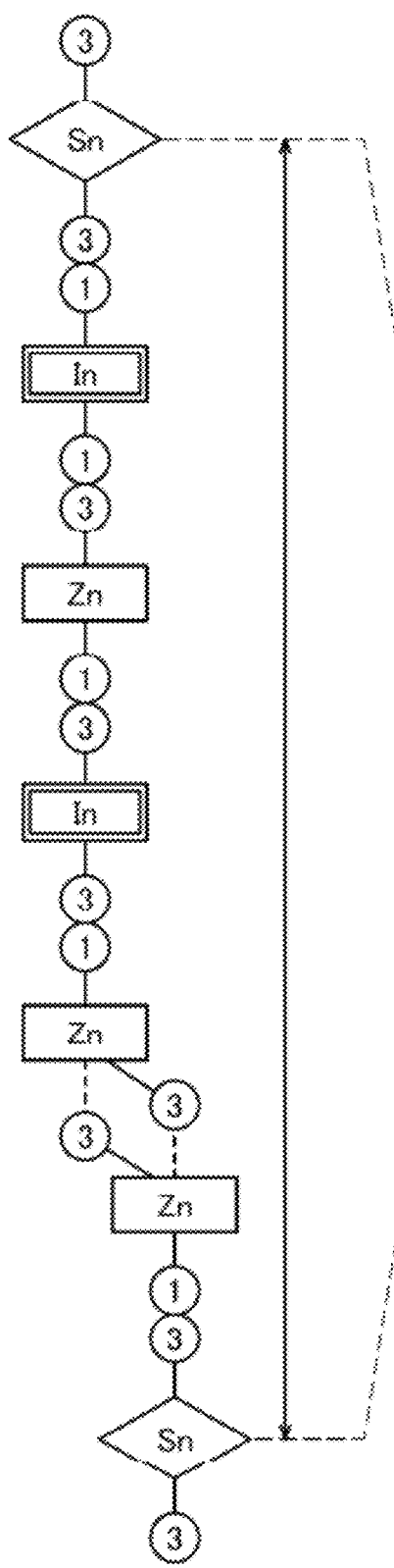
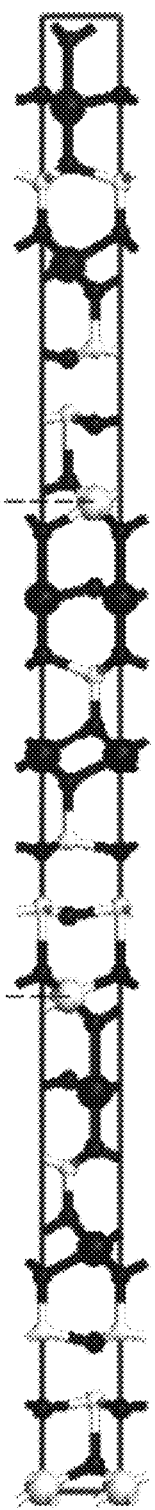
● In
○ Sn
◔ Zn
• O

● In
○ Ga
○ Zn
● O

SEMICONDUCTOR INTEGRATED CIRCUIT

BACKGROUND OF THE INVENTION

1. Field of the Invention

One embodiment of the disclosed invention relates to a semiconductor integrated circuit.

2. Description of the Related Art

In recent years, the number and the kinds of components used for electric devices, such as an IC, have been markedly increased because of a variety of usages or specifications of electric devices. In order to operate such components, a power source circuit that supplies voltage and current corresponding to each component is needed (see Patent Document 1.)

REFERENCE

Patent Document

[Patent Document 1] Japanese Published Patent Application No. 2011-96699

SUMMARY OF THE INVENTION

However, such an electric device having a number of and a variety kinds of components generates heat in operation of the above-described power source circuit, so that the power source circuit is broken because of the heat; moreover, the electric device is broken because of the heat.

In view of the above, an object of one embodiment of the disclosed invention is to prevent a power source circuit from being broken because of heat.

An object of one embodiment of the disclosed invention is to provide a protective circuit to prevent the power source circuit from being broken because of heat.

One embodiment of the disclosed invention relates to a semiconductor integrated circuit that includes a voltage converter circuit and a control circuit including a voltage divider circuit and a protective circuit. The protective circuit includes a first oxide semiconductor transistor in which an off-state current is increased as temperature is increased, a capacitor that accumulates the off-state current as electric charge, a second oxide semiconductor transistor, and an operational amplifier. The first oxide semiconductor transistor is provided near an element that generates heat in the voltage converter circuit or the control circuit.

The first oxide semiconductor transistor provided near the element that generates heat is affected by the heat and when the temperature of the first oxide semiconductor transistor is increased, a leakage current of the first oxide semiconductor transistor in an off state is increased (hereinafter, in this specification, a leakage current of an oxide semiconductor transistor in an off state is referred to as an off-state current.). The off-state current is accumulated in the capacitor as electric charge. When the electric charge is accumulated in the capacitor, voltage of a portion electrically connected to the first oxide semiconductor transistor, the capacitor, and an inverting input terminal of the operational amplifier is increased. When the voltage of the portion is increased and exceeds a first reference voltage input to a non-inverting input terminal of the operational amplifier, the output voltage of the operational amplifier shifts in the positive direction. In this way, it can be detected that the temperature of the element provided near the first oxide semiconductor transistor reaches a predetermined temperature.

In this manner, the temperature of an element that generates heat can be detected and the operation of the element that generates heat is stopped, so that the temperature of the element that generates heat can be prevented from exceeding an operating temperature limit.

Provision of such a protective circuit can prevent a semiconductor integrated circuit from being broken because of heat.

In one embodiment of the disclosed invention, the control circuit includes a bias generation circuit, a reference voltage generation circuit, a band gap reference, and a voltage regulator circuit.

In one embodiment of the disclosed invention, the voltage converter circuit is a DC-DC converter.

In one embodiment of the disclosed invention, the voltage converter circuit is an AC-DC converter.

One embodiment of the disclosed invention can prevent a power source circuit from being broken because of heat.

One embodiment of the disclosed invention can provide a protective circuit to prevent a power source circuit from being broken because of heat.

BRIEF DESCRIPTION OF THE DRAWINGS

FIGS. 8A to 8C illustrate a crystal structure of an oxide material.

DETAILED DESCRIPTION OF THE INVENTION

Figure 1:
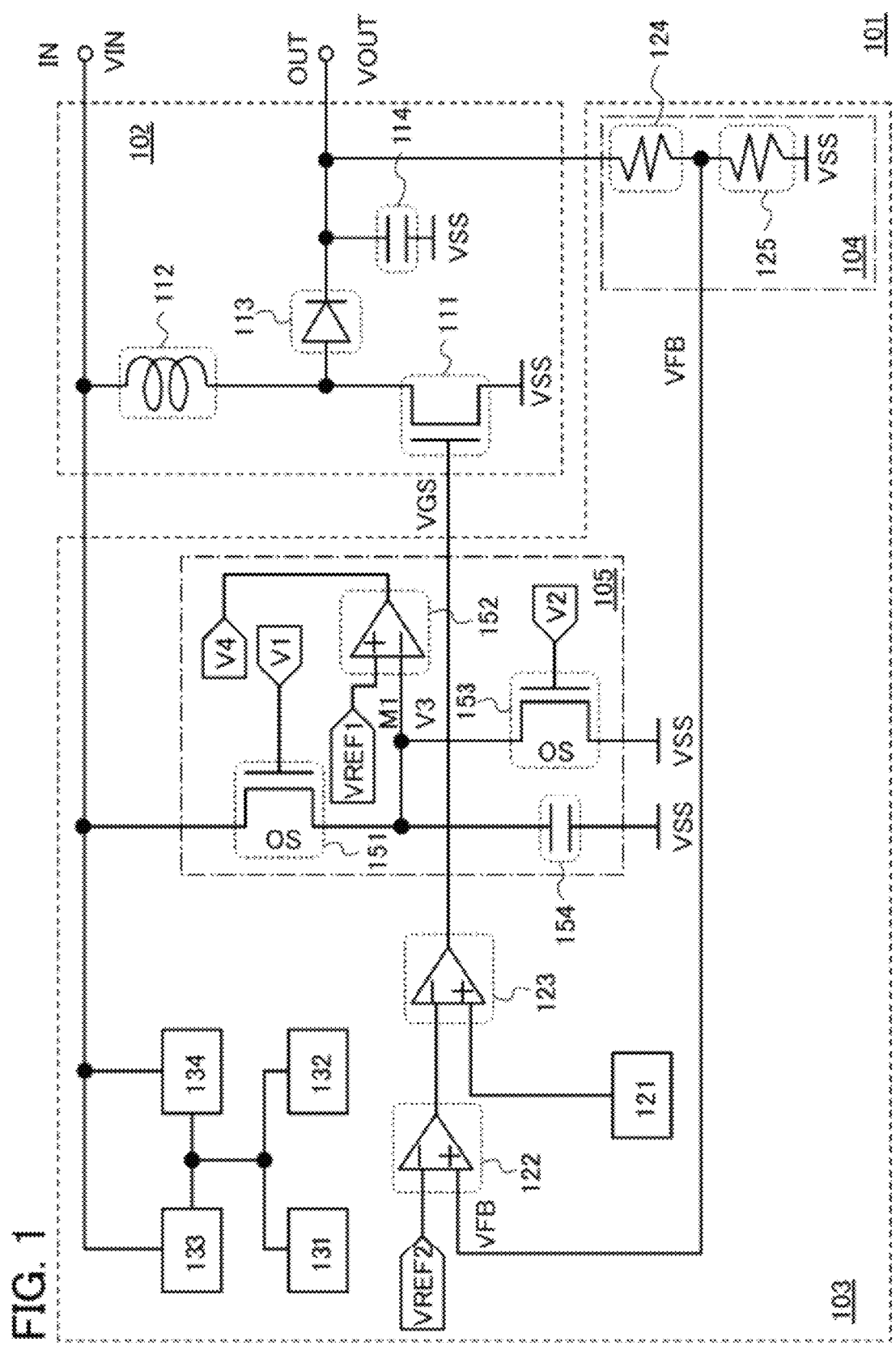
FIG. 1 is a circuit diagram of a semiconductor integrated circuit.

Embodiments of the invention disclosed in this specification are hereinafter described with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope thereof Therefore, the present invention is not construed as being limited to description of the embodiments. Note that, in the drawings hereinafter shown, the same portions or portions having similar functions are denoted by the same reference numerals, and repeated description thereof is omitted.

Note that in the invention disclosed in this specification, a semiconductor device refers to an element or a device in general which functions by utilizing a semiconductor and includes, in its category, an electric device including an electronic circuit, a display device, a light-emitting device, and the like and an electronic appliance on which the electric device is mounted.

Note that the position, size, range, or the like of each structure shown in the drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

[Embodiment 1]
<Circuit Configuration>

FIG. 1 illustrates an example of a configuration of a power source circuit 101. The power source circuit 101 includes a voltage converter circuit 102 and a control circuit 103 for the voltage converter circuit 102. The control circuit 103 includes a voltage divider circuit 104 and a protective circuit 105.

A pulse width modulation signal VGS is input from the control circuit 103 to the voltage converter circuit 102, specifically, from an output terminal of a pulse width modulation output driver 123 of the control circuit 103 to a gate of a transistor 111 of the voltage converter circuit 102, so that the voltage converter circuit 102 is controlled.

The voltage converter circuit 102 and the control circuit 103 are electrically connected to an input terminal IN to which an input voltage VIN is input. The voltage converter circuit 102 is electrically connected to an output terminal OUT which outputs an output voltage VOUT. The voltage divider circuit 104 makes part of the output voltage VOUT to be fed back to the control circuit 103 as a feedback voltage VFB.

The voltage converter circuit 102 is a DC-DC converter including a transistor 111, a coil 112, a diode 113, and a capacitor 114.

A DC-DC converter is a circuit that converts a direct current voltage to another direct current voltage. Typical conversion modes of a DC-DC converter include a linear mode and a switching mode. A switching mode DC-DC converter has excellent conversion efficiency. In this embodiment, a switching mode DC-DC converter, particularly a chopper-type DC-DC converter, including a transistor, a coil, a diode, and a capacitor is used as the voltage converter circuit 102.

The control circuit 103 includes the voltage divider circuit 104, the protective circuit 105, a triangle-wave generation circuit 121, an error amplifier circuit (also referred to as an error amplifier) 122, the pulse width modulation output driver 123, a bias generation circuit 131, a reference voltage generation circuit 132, a band gap reference 133, and a voltage regulator circuit 134.

The voltage divider circuit 104 includes a resistor 124 and a resistor 125. The voltage divider circuit 104 divides the output voltage VOUT output from the output terminal OUT in accordance with the resistance values of the resistor 124 and the resistor 125. The voltage divider circuit 104 makes part of the output voltage VOUT to be output from the voltage divider circuit 104 as the feedback voltage VFB and input to a non-inverting input terminal of the error amplifier circuit 122.

The protective circuit 105 includes an oxide semiconductor transistor 151 in which a channel formation region is formed in an oxide semiconductor film, an operational amplifier 152, an oxide semiconductor transistor 153, and a capacitor 154.

A voltage V1 is input to a gate of the oxide semiconductor transistor 151. When the voltage V1 is a high-level potential (VH), the oxide semiconductor transistor 151 is in a conducting state (also referred to as an on state). When the voltage V1 is a low-level potential (VL), the oxide semiconductor transistor 151 is in a non-conducting state (also referred to as an off state). One of a source and a drain of the oxide semiconductor transistor 151 is electrically connected to the input terminal IN to which the input voltage VIN is input. The other of the source and the drain of the oxide semiconductor transistor 151 is electrically connected to an inverting input terminal of the operational amplifier 152, one of a source and a drain of the oxide semiconductor transistor 153, and one terminal of the capacitor 154.

Note that a portion to which the other of the source and the drain of the oxide semiconductor transistor 151, the one of the source and the drain of the oxide semiconductor transistor 153, the inverting input terminal of the operational amplifier 152, and the one terminal of the capacitor 154 are connected is a node M1.

The oxide semiconductor transistor 151 detects a leakage current (off-state current) in a non-conducting state (off state). The voltage V1 input to the gate of the oxide semiconductor transistor 151 is preferably lower than or equal to 0 V, which brings the oxide semiconductor transistor 151 completely in a non-conducting state.

The oxide semiconductor transistors 151 are each provided near an element that generates heat such as a transistor 111 or a diode 113 of the voltage converter circuit 102 or an element included in a circuit that generates heat such as a voltage regulator circuit 134, for example. As the arrangement of the element that generates heat and the oxide semiconductor transistors 151, for example, a multi-finger layout, a common-centroid layout, or the like in which a plurality of transistors are provided alternately may be used. The element that generates heat and the oxide semiconductor transistors 151 may be provided laterally (in the horizontal direction) to each other, so that they are close to each other. Alternatively, the element that generates heat and the oxide semiconductor transistors 151 may be overlapped with each other (in the vertical direction), so that these are close to each other. Note that the arrangement of the element that generates heat and the oxide semiconductor transistors 151 is described in detail later.

Figure 3:
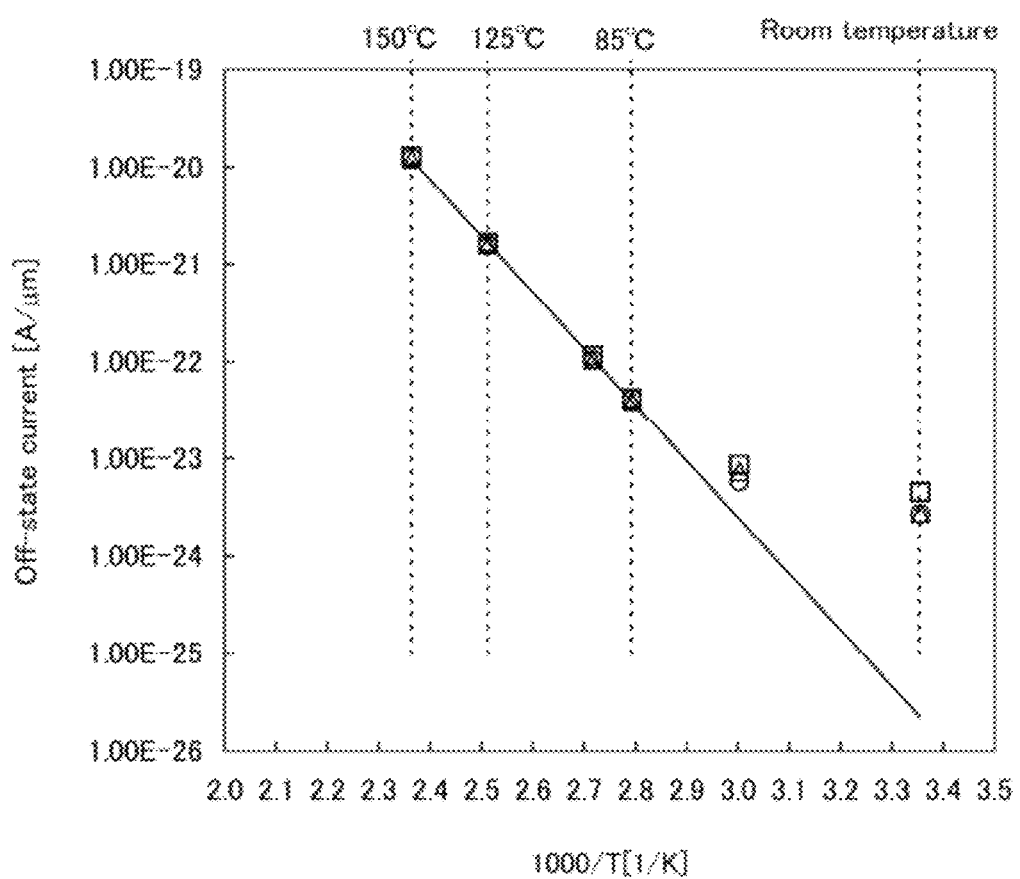
FIG. 3 is a graph showing a relation between an off-state current and temperature.

FIG. 3 shows a relation between temperature and an off-state current of an oxide semiconductor transistor of this embodiment.

The oxide semiconductor transistor used for the graph in FIG. 3 has a channel length (length of a channel formation region) L of 3 μm, a channel width (width of the channel formation region) W of 10 cm, and a length (length of a portion of a source or drain region which does not overlap with a gate electrode) $L_{off}$ of 2 μm. Further, the value of the off-state current in FIG. 3 is the value per unit channel width (1 μm) of an off-state current obtained from a measurement.

Note that FIG. 3 shows temperatures and off-state currents of three oxide semiconductor transistors each of which has the above-described channel length L, channel width W, and length $L_{off}$ that are measured (the measurement results of the three oxide semiconductor transistors are indicated by a circle sign, a triangle sign, and a square sign). A straight line in FIG. 3 shows a calculation result obtained from the measurement results of the three oxide semiconductor transistors with an assumption that the off-state current changes linearly with respect to temperature.

As shown in FIG. 3, the off-state current of the oxide semiconductor transistor of this embodiment is larger, as the temperature is higher. Further, the off-state current changes linearly with respect to the temperatures in the range of 85° C. or higher and 150° C. or lower. By utilizing this, the temperature of an element that generates heat can be detected by the oxide semiconductor transistor 151 and the operation of the element that generates heat is stopped. The operation of the element that generates heat is stopped, so that the temperature of the element that generates heat is prevented from exceeding an operating temperature limit.

The off-state current of the oxide semiconductor transistor of this embodiment is extremely small even at a high temperature (e.g., about 150° C.); the off-state current per channel length (1 μm) is $1 \times 10^{-20}$ A. Accordingly, the channel width W is widened, so that the off-state current can be increased. Thus, the channel width W of the oxide semiconductor transistor 151 is preferably longer than or equal to 1 m.

Table 1 shows a calculation result of a voltage V3 of the node M1 at the time when the oxide semiconductor transistor 151 has a channel length L of 3 μm and a channel width W of $1 \times 10^6$ μm (1 m), the capacitor 154 has a capacitance of $1 \times 10^{-10}$ F, and a period (period T) in which electric charge accumulated in the capacitor 154 is refreshed is 5 seconds. Note that the measurement result of FIG. 3 is used for the value of the off-state current in Table 1. The details of the period T are described later.

TABLE 1

|  | 85° C. | 150° C. |
|---|---|---|
| voltage V3 (V) | 2.00E−06 | 5.00E−04 |
| channel length L (μm) | 3 | 3 |
| channel width W (μm) | 1.00E+06 | 1.00E+06 |
| off-state current (A) | 4.00E−23 | 1.00E−20 |
| period T (S) | 5 | 5 |
| capacitance (F) | 1.00E−10 | 1.00E−10 |

As shown in Table 1, when the channel width W is 1 m, a voltage value sufficient for the voltage V3 can be obtained. Although the details of the operation of the power source circuit 101 are described later, the voltage value sufficient for the voltage V3 is obtained, so that the operational amplifier 152 can be operated, and then, a voltage V4 can be output from the operational amplifier 152. In this way, the temperature of an element that generates heat and the temperature limit thereof can be detected.

However, as the off-state current of the oxide semiconductor transistor 151 is increased, the current consumption of the power source circuit 101 is increased. Thus, the channel width W of the oxide semiconductor transistor 151 needs to be determined in consideration of a relation between current consumption and an off-state current needed for detecting the temperature of an element that generates heat and the temperature limit thereof.

Note that the off-state current of the oxide semiconductor transistor 151 varies depending on, as well as the channel width W, the thickness of a gate insulating film, the size, and the like of the oxide semiconductor transistor 151. Thus, the thickness of a gate insulating film, the size, and the like of the oxide semiconductor transistor 151 need to be determined depending on the temperature to be detected.

The inverting input terminal of the operational amplifier 152 is electrically connected to the other of the source and the drain of the oxide semiconductor transistor 151, the one of the source and the drain of the oxide semiconductor transistor 153, and the one terminal of the capacitor 154. A first reference voltage VREF1 is input to a non-inverting input terminal of the operational amplifier 152. The output voltage V4 is output from an output terminal of the operational amplifier 152 to the outside.

Note that the output voltage V4 shifts in the positive direction when voltage input to the inverting input terminal of the operational amplifier 152 exceeds the first reference voltage VREF1 input to the non-inverting input terminal of the operational amplifier 152, which is described in detail later. Accordingly, the operational amplifier 152 can be regarded as a comparator.

The voltage V2 is input to a gate of the oxide semiconductor transistor 153. When the voltage V2 is a high-level potential (VH), the oxide semiconductor transistor 153 is in a conducting state. When the voltage V2 is a low-level potential (VL), the oxide semiconductor transistor 153 is in a non-conducting state. The one of the source and the drain of the oxide semiconductor transistor 153 is electrically connected to the other of the source and the drain of the oxide semiconductor transistor 151, the inverting input terminal of the operational amplifier 152, and the one terminal of the capacitor 154. The low-level potential (VL), which is a reference voltage, is input to the other of the source and the drain of the oxide semiconductor transistor 153. Note that a ground potential GND is used as the low-level potential (VL), which is a reference voltage, for example.

The oxide semiconductor transistor 153 makes electric charge accumulated in the capacitor 154 to be refreshed every certain period (period T). When the voltage V2, which is the high-level potential (VH), is input to the gate of the oxide semiconductor transistor 153, the oxide semiconductor transistor 153 is in a conducting state. The low-level potential (VL), e.g., a ground potential GND, is input to the other of the source and the drain of the oxide semiconductor transistor 153, so that the potential of the one of the source and the drain of the oxide semiconductor transistor 153 is also a ground potential GND. The one of the source and the drain of the oxide semiconductor transistor 153 is electrically connected to the one terminal of the capacitor 154; thus, the electric charge accumulated in the capacitor 154 is released.

When the channel width of the oxide semiconductor transistor 153 is longer than the channel width of the oxide semiconductor transistor 151, the off-state current of the oxide semiconductor transistor 153 exceeds the off-state current of the oxide semiconductor transistor 151.

When the off-state current of the oxide semiconductor transistor 153 exceeds the off-state current of the oxide semiconductor transistor 151, electric charge is not accumulated in the capacitor 154.

Thus, the channel width of the oxide semiconductor transistor 151 needs to be longer than the channel width of the oxide semiconductor transistor 153.

The one terminal of the capacitor 154 is electrically connected to the other of the source and the drain of the oxide semiconductor transistor 151, the inverting input terminal of the operational amplifier 152, and the one of the source and the drain of the oxide semiconductor transistor 153. The low-level potential (VL), which is a reference voltage, is input to the other terminal of the capacitor 154. Note that as the low-level potential (VL), which is a reference voltage, a ground potential GND is used, for example.

The reference voltage generation circuit 132 generates a second reference voltage VREF2.

The error amplifier circuit 122 integrates a difference between the second reference voltage VREF2 generated in the reference voltage generation circuit 132 and the feedback voltage VFB, and outputs a signal obtained by integrating the difference to the pulse width modulation output driver 123.

The triangle-wave generation circuit 121 generates a triangle wave using the second reference voltage VREF2 and a reference current generated using the second reference voltage VREF2, and outputs the triangle wave to the pulse width modulation output driver 123.

The pulse width modulation output driver 123 compares the output from the error amplifier circuit 122 with the triangle wave from the triangle-wave generation circuit 121, and outputs a pulse width modulation signal VGS to the transistor 111.

The bias generation circuit 131 is a circuit by which a bias voltage or a bias current is applied. Application of the bias voltage or the bias current can make current always flow in one direction.

The band gap reference 133 generates a reference voltage utilizing band gap energy of silicon.

The voltage regulator circuit 134 adjusts an output voltage to be constant.

The operation of the protective circuit 105 is described below.

<Operation>

When an element provided near the protective circuit 105 generates heat, the temperature of the oxide semiconductor transistor 151 is increased. As described above, the off-state current of the oxide semiconductor transistor 151 is increased, as the temperature is higher. The increased off-state current of the oxide semiconductor transistor 151 is accumulated in the capacitor 154 as electric charge. When the electric charge is accumulated in the capacitor 154 during the period T, the voltage V3 of the node M1 is increased. When the voltage V3 of the node M1 is increased and the voltage V3 exceeds the first reference voltage VREF1 that is input to the non-inverting input terminal of the operational amplifier 152, the output voltage V4 of the operational amplifier 152 shifts in the positive direction. In this way, it can be detected that the temperature of the element provided near the protective circuit 105 reaches a predetermined temperature.

When the voltage V3 of the node M1 does not exceed the first reference voltage VREF1 that is input to the non-inverting input terminal of the operational amplifier 152 during the period T, the output voltage V4 of the operational amplifier 152 is not shifted.

When the output voltage V4 of the operational amplifier 152 is intermittently shifted every period T, the operation of an element that generates heat or the power source circuit 101 is stopped in order to protect the control circuit 103.

The length of the period T is changed depending on the off-state current of the oxide semiconductor transistor 151, the capacitance of the capacitor 154, and the voltage value of the voltage V3 of the node M1, and is preferably one second or longer and ten seconds or shorter.

<Another Example of Circuit Configuration>

Figure 2:
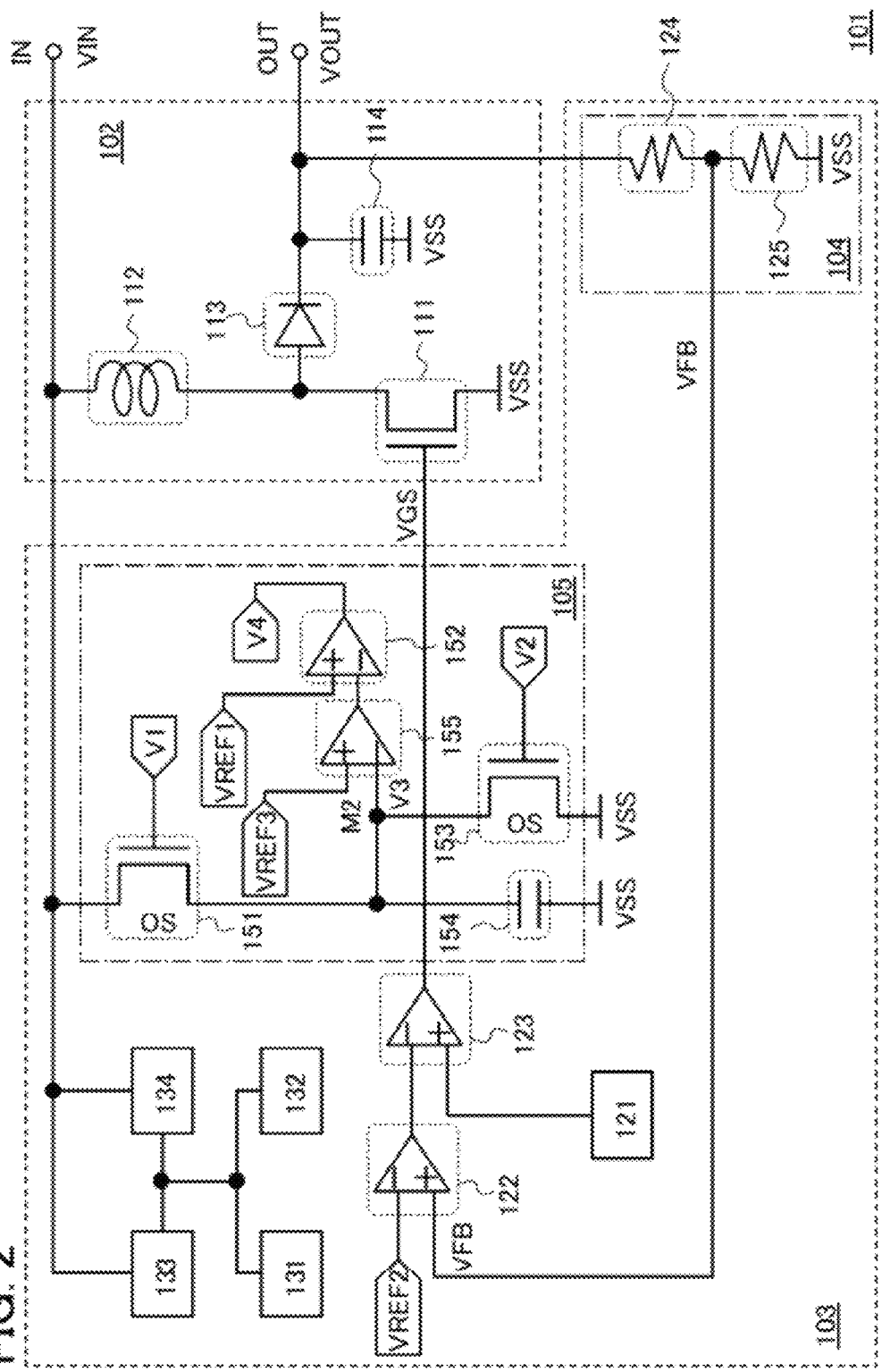
FIG. 2 is a circuit diagram of a semiconductor integrated circuit.

FIG. 2 illustrates an example of a configuration of a power source circuit, which is different from the one in FIG. 1. In the power source circuit 101 illustrated in FIG. 2, an operational amplifier 155 is provided between the operational amplifier 152 and the one of the source and the drain of the oxide semiconductor transistor 153.

An inverting input terminal of the operational amplifier 155 is electrically connected to the other of the source and the drain of the oxide semiconductor transistor 151, the one of the source and the drain of the oxide semiconductor transistor 153, and the one terminal of the capacitor 154. A third reference voltage VREF3 is input to a non-inverting input terminal of the operational amplifier 155. The output terminal of the operational amplifier 155 is electrically connected to the inverting input terminal of the operational amplifier 152.

Note that a portion to which the other of the source and the drain of the oxide semiconductor transistor 151, the one of the source and the drain of the oxide semiconductor transistor 153, the one terminal of the capacitor 154, and the inverting input terminal of the operational amplifier 155 are connected is a node M2. The voltage of the node M2 is the voltage V3, which is same as the node M1. The operational amplifier 155 amplifies the voltage V3 and outputs it to the operational amplifier 152.

As described above, this embodiment can provide a protective circuit to prevent a power source circuit and an electric device from being broken because of heat.

<Oxide Semiconductor Transistor>

An oxide semiconductor transistor according to this embodiment is described below.

Figure 4A:
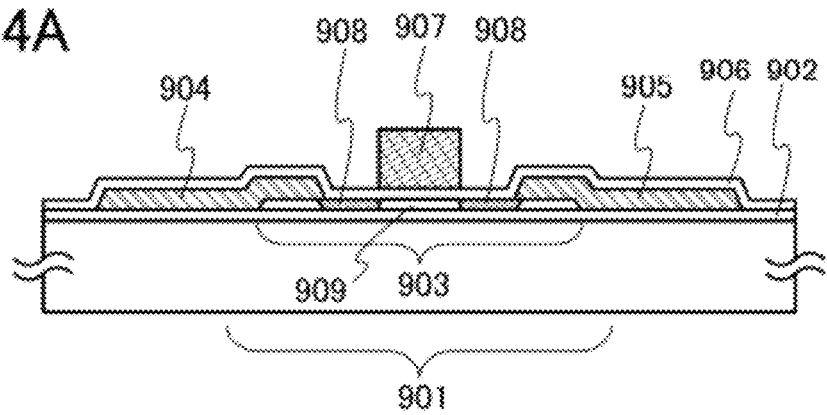
FIGS. 4A and 4B are cross-sectional views of oxide semiconductor transistors.

An oxide semiconductor transistor 901 illustrated in FIG. 4A includes an oxide semiconductor layer 903 that is formed over an insulating film 902 and functions as an active layer; a source electrode 904 and a drain electrode 905 formed over the oxide semiconductor layer 903; a gate insulating film 906 over the oxide semiconductor layer 903, the source electrode 904, and the drain electrode 905; and a gate electrode 907 that is provided over the gate insulating film 906 and overlaps with the oxide semiconductor layer 903.

The oxide semiconductor transistor 901 illustrated in FIG. 4A is of a top-gate type where the gate electrode 907 is formed over the oxide semiconductor layer 903, and is also of a top-contact type where the source electrode 904 and the drain electrode 905 are formed over the oxide semiconductor layer 903. In the oxide semiconductor transistor 901, the source electrode 904 and the drain electrode 905 do not overlap with the gate electrode 907. That is, the distance between the gate electrode 907 and each of the source electrode 904 and the drain electrode 905 is larger than the thickness of the gate insulating film 906. Therefore, in the oxide semiconductor transistor 901, the parasitic capacitance generated between the gate electrode 907 and each of the source electrode 904 and the drain electrode 905 can be small, so that the oxide semiconductor transistor 901 can operate at high speed.

The oxide semiconductor layer 903 includes a pair of high-concentration regions 908 that are obtained by addition of dopant imparting n-type conductivity to the oxide semiconductor layer 903 after formation of the gate electrode 907. Further, the oxide semiconductor layer 903 includes a channel formation region 909 that overlaps with the gate electrode 907 with the gate insulating film 906 interposed therebetween. In the oxide semiconductor layer 903, the channel formation region 909 is provided between the pair of high-concentration regions 908. The addition of dopant for forming the high-concentration regions 908 can be performed by an ion implantation method. As the dopant, for example, a rare gas such as helium, argon, or xenon, a Group 15 element such as nitrogen, phosphorus, arsenic, or antimony, or the like can be used.

For example, in the case where nitrogen is used as the dopant, the concentration of nitrogen atoms in the high-concentration regions 908 is preferably higher than or equal to $5 \times 10^{19}/cm^3$ and lower than or equal to $1 \times 10^{22}/cm^3$.

The high-concentration regions 908 to which the dopant imparting n-type conductivity is added have higher conductivity than the other regions in the oxide semiconductor layer 903. Therefore, with provision of the high-concentration regions 908 in the oxide semiconductor layer 903, the resistance between the source electrode 904 and the drain electrode 905 can be decreased.

The oxide semiconductor layer 903 may include a c-axis aligned crystalline oxide semiconductor (CAAC-OS). In the case where the oxide semiconductor layer 903 includes the CAAC-OS, the conductivity of the oxide semiconductor layer 903 can be increased as compared to the case of an amorphous semiconductor; thus, the resistance between the source electrode 904 and the drain electrode 905 can be decreased. The CAAC-OS is described later.

By decreasing the resistance between the source electrode 904 and the drain electrode 905, a large on-state current and high-speed operation can be ensured even when the oxide semiconductor transistor 901 is miniaturized. With the miniaturization of the oxide semiconductor transistor 901, the area occupied by the storage element including the transistor can be reduced and the storage capacity per unit area can be increased.

The oxide semiconductor transistor 901 illustrated in FIG. 4A may include a sidewall formed using an insulating film at a side portion of the gate electrode 907. A low-concentration region may be formed with the use of the sidewall between the channel formation region 909 and the high-concentration region 908. With provision of the low-concentration region, a negative shift in the threshold voltage due to a short-channel effect can be reduced.

The oxide semiconductor transistor 901 can be used as one or both of the oxide semiconductor transistor 151 and the oxide semiconductor transistor 153. Further, each of the operational amplifier 152 and the operational amplifier 155 may include the oxide semiconductor transistor 901.

Further, the oxide semiconductor transistor 901 can also be used as a transistor or the diode 113 in the voltage converter circuit 102. When the diode 113 is formed using the oxide semiconductor transistor 901, a gate of the oxide semiconductor transistor 901 may be connected to one of a source and a drain thereof (diode-connection).

Further, each of the triangle-wave generation circuit 121, the error amplifier circuit 122, the pulse width modulation output driver 123, the bias generation circuit 131, the reference voltage generation circuit 132, the band gap reference 133, and the voltage regulator circuit 134 in the control circuit 103 can include the oxide semiconductor transistor 901.

Figure 4B:
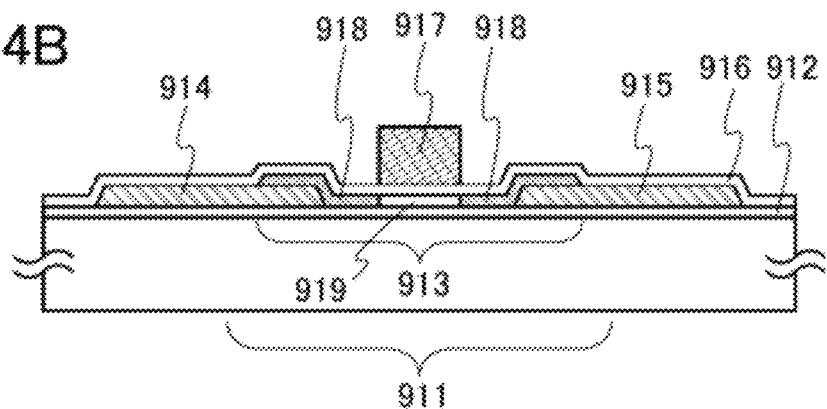

An oxide semiconductor transistor 911 illustrated in FIG. 4B includes a source electrode 914 and a drain electrode 915 formed over an insulating film 912; an oxide semiconductor layer 913 that is formed over the source electrode 914 and the drain electrode 915 and functions as an active layer; a gate insulating film 916 over the oxide semiconductor layer 913, the source electrode 914, and the drain electrode 915; and a gate electrode 917 that is provided over the gate insulating film 916 and overlaps with the oxide semiconductor layer 913.

The oxide semiconductor transistor 911 illustrated in FIG. 4B is of a top-gate type where the gate electrode 917 is formed over the oxide semiconductor layer 913, and is also of a bottom-contact type where the source electrode 914 and the drain electrode 915 are formed below the oxide semiconductor layer 913. In the oxide semiconductor transistor 911, the source electrode 914 and the drain electrode 915 do not overlap with the gate electrode 917 as in the oxide semiconductor transistor 901; thus, the parasitic capacitance generated between the gate electrode 917 and each of the source electrode 914 and the drain electrode 915 can be small, so that the oxide semiconductor transistor 911 can operate at high speed.

The oxide semiconductor layer 913 includes a pair of high-concentration regions 918 that are obtained by addition of dopant imparting n-type conductivity to the oxide semiconductor layer 913 after formation of the gate electrode 917. Further, the oxide semiconductor layer 913 includes a channel formation region 919 that overlaps with the gate electrode 917 with the gate insulating film 916 interposed therebetween. In the oxide semiconductor layer 913, the channel formation region 919 is provided between the pair of high-concentration regions 918.

Like the above-described high-concentration regions 908 included in the oxide semiconductor transistor 901, the high-concentration regions 918 can be formed by an ion implantation method. The kind of dopant in the case of the high-concentration regions 908 can be referred to for the kind of dopant for forming the high-concentration regions 918.

For example, in the case where nitrogen is used as the dopant, the concentration of nitrogen atoms in the high-concentration regions 918 is preferably higher than or equal to $5\times10^{19}/cm^3$ and lower than or equal to $1\times10^{22}/cm^3$.

The high-concentration regions 918 to which the dopant imparting n-type conductivity is added have higher conductivity than the other regions in the oxide semiconductor layer 913. Therefore, by providing the high-concentration regions 918 in the oxide semiconductor layer 913, the resistance between the source electrode 914 and the drain electrode 915 can be decreased.

The oxide semiconductor layer 913 may include a CAAC-OS. In the case where the oxide semiconductor layer 913 includes a CAAC-OS, the conductivity of the oxide semiconductor layer 913 can be increased as compared to the case of an amorphous semiconductor; thus, the resistance between the source electrode 914 and the drain electrode 915 can be decreased.

By decreasing the resistance between the source electrode 914 and the drain electrode 915, a large on-state current and high-speed operation can be ensured even when the oxide semiconductor transistor 911 is miniaturized.

The oxide semiconductor transistor 911 illustrated in FIG. 4B may include a sidewall formed using an insulating film at a side portion of the gate electrode 917. A low-concentration region may be formed with the use of the sidewall between the channel formation region 919 and the high-concentration region 918. With provision of the low-concentration region, a negative shift in the threshold voltage due to a short-channel effect can be reduced.

The oxide semiconductor transistor 911 can be used as one or both of the oxide semiconductor transistor 151 and the oxide semiconductor transistor 153. Further, each of the operational amplifier 152 and the operational amplifier 155 may include the oxide semiconductor transistor 911.

Further, the oxide semiconductor transistor 911 can also be used as a transistor or the diode 113 in the voltage converter circuit 102. When the diode 113 is formed using the oxide semiconductor transistor 911, a gate of the oxide semiconductor transistor 911 may be connected to one of a source and a drain thereof (diode-connection).

Further, each of the triangle-wave generation circuit 121, the error amplifier circuit 122, the pulse width modulation output driver 123, the bias generation circuit 131, the reference voltage generation circuit 132, the band gap reference 133, and the voltage regulator circuit 134 in the control circuit 103 can include the oxide semiconductor transistor 911.

Figure 5A:
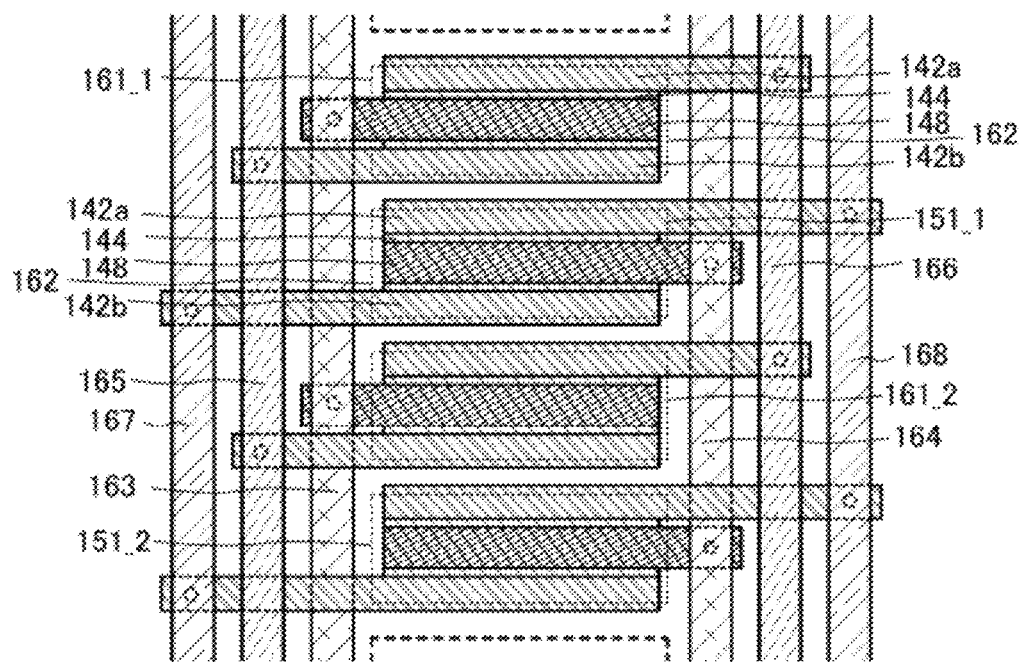
FIGS. 5A and 5B are top views each illustrating an arrangement of an oxide semiconductor transistor.
Figure 5B:
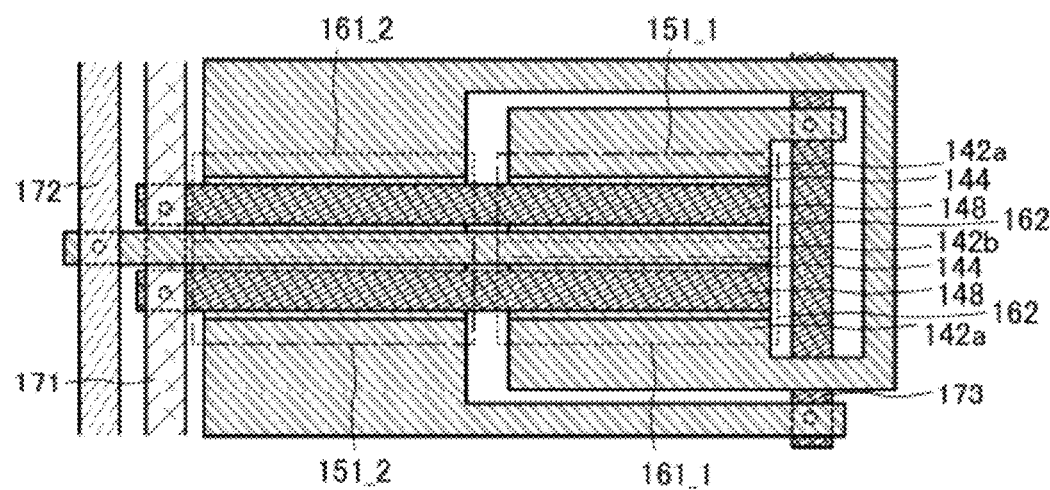

FIGS. 5A and 5B illustrate an example of the arrangement of an element that generates heat and the oxide semiconductor transistor 151.

FIGS. 5A and 5B illustrate a top view of a multi-finger layout and a top view of a common-centroid layout, respectively; each of the arrangements includes oxide semiconductor transistors 161 each of which serves as an element that generates heat or an element included in a circuit that generates heat and the oxide semiconductor transistors 151.

Note that in FIGS. 5A and 5B, an oxide semiconductor transistor 162 is used as each of the oxide semiconductor transistors 151 (an oxide semiconductor transistor 151_1 and an oxide semiconductor transistor 151_2) and the oxide semiconductor transistors 161 (an oxide semiconductor transistor 161_1 and an oxide semiconductor transistor 161_2). The oxide semiconductor transistor 162 includes an oxide semiconductor film 144, electrodes 142a and 142b which serve as source and drain electrodes, and a gate electrode 148.

FIG. 5A illustrates an example of a multi-finger layout of the oxide semiconductor transistors 151 and the oxide semiconductor transistors 161.

The oxide semiconductor transistors 151 and the oxide semiconductor transistors 161 are provided alternately in FIG. 5A. When the oxide semiconductor transistors 151 and the oxide semiconductor transistors 161 are provided alternately, the oxide semiconductor transistors 161 generate heat, the temperature of the oxide semiconductor transistors 161 is increased, and the temperature of the oxide semiconductor transistors 151 is also increased. Accordingly, the off-state current of the oxide semiconductor transistors 151 is increased. As described above, the off-state of the oxide semiconductor transistors 151 is increased, so that the temperature of the oxide semiconductor transistors 161 and the temperature limit thereof can be detected.

In FIG. 5A, the gate electrode 148 of the oxide semiconductor transistor 151_1 and the gate electrode 148 of the oxide semiconductor transistor 151_2 are electrically connected to each other via a wiring 164. The electrode 142a serving as one of source and drain electrodes of the oxide semiconductor transistor 151_1 and the electrode 142a serving as one of source and drain electrodes of the oxide semiconductor transistor 151_2 are electrically connected to each other via a wiring 168. The electrode 142b serving as the other of the source and drain electrodes of the oxide semiconductor transistor 151_1 and the electrode 142b serving as the other of source and drain electrodes of the oxide semiconductor transistor 151_2 are electrically connected to each other via a wiring 167.

The gate electrode 148 of the oxide semiconductor transistor 161_1 and the gate electrode 148 of the oxide semiconductor transistor 161_2 are electrically connected to each other via a wiring 163. The electrode 142a serving as one of source and drain electrodes of the oxide semiconductor transistor 161_1 and the electrode 142a serving as one of source and drain electrodes of the oxide semiconductor transistor 161_2 are electrically connected to each other via a wiring 166. The electrode 142b serving as the other of source and drain electrodes of the oxide semiconductor transistor 161_1 and the electrode 142b serving as the other of source and drain electrodes of the oxide semiconductor transistor 161_2 are electrically connected to each other via a wiring 165.

FIG. 5B illustrates an example of a common-centroid layout of the oxide semiconductor transistors 151 and the oxide semiconductor transistors 161. Note that in FIG. 5B, the oxide semiconductor transistors 151 are indicated by dashed-dotted line, and the oxide semiconductor transistors 161 are indicated by a dotted line.

In FIG. 5B, the oxide semiconductor transistors 151 and the oxide semiconductor transistors 161 are provided alternately. With such a structure, the oxide semiconductor transistors 161 generate heat and the temperature of the oxide semiconductor transistors 161 is increased, and the temperature of the oxide semiconductor transistors 151 is also increased. Accordingly, the off-state current of the oxide semiconductor transistors 151 is increased. As described above, the off-state current of the oxide semiconductor transistors 151 is increased, so that the temperature of the oxide semiconductor transistors 161 and the temperature limit thereof can be detected.

In FIG. 5B, the gate electrode 148 of the oxide semiconductor transistor 151_1 and the oxide semiconductor transistor 161_2 is formed using a conductive film. Further, the gate electrode 148 of the oxide semiconductor transistor 151_2 and the oxide semiconductor transistor 161_1 is formed using a conductive film.

The gate electrode 148 of the oxide semiconductor transistor 151_1 and the oxide semiconductor transistor 161_2 is electrically connected to the gate electrode 148 of the oxide semiconductor transistor 151_2 and the oxide semiconductor transistor 161_1 via a wiring 171.

The electrode 142a serving as the one of the source and drain electrodes of the oxide semiconductor transistor 151_1 and the electrode 142a serving as the one of the source and drain electrodes of the oxide semiconductor transistor 151_2 are electrically connected to each other via a wiring 173. The electrode 142a serving as the one of the source and drain electrodes of the oxide semiconductor transistor 161_1 and the one of the source and drain electrodes of the oxide semiconductor transistor 161_2 is formed using a conductive film.

The electrode 142b serving as the other of the source and drain electrodes of the oxide semiconductor transistor 151_1, oxide semiconductor transistor 151_2, the oxide semiconductor transistor 161_1, or the oxide semiconductor transistor 161_2 is formed using a conductive film. Further, the electrode 142b is electrically connected to a wiring 172.

Figure 6:
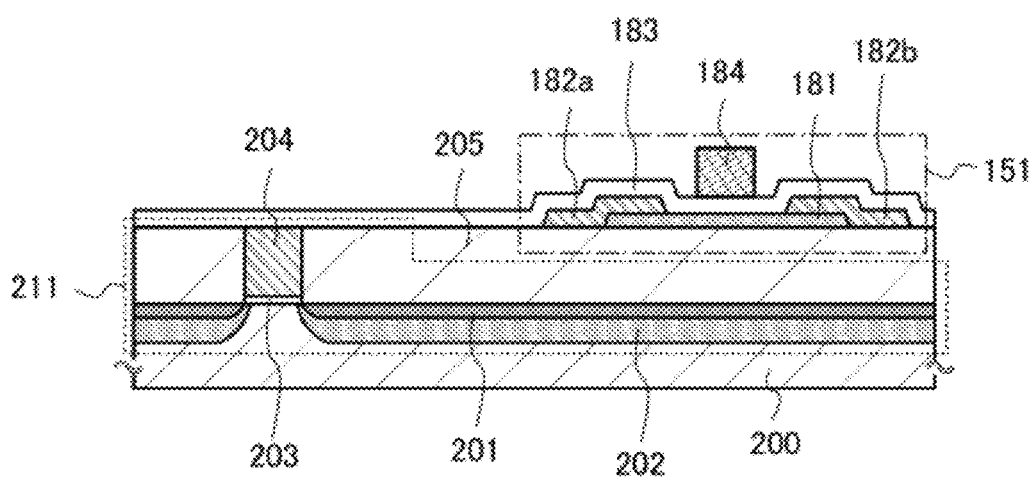
FIG. 6 is a cross-sectional view illustrating an arrangement of an oxide semiconductor transistor.

FIG. 6 illustrates another example of the arrangement of an element that generates heat and the oxide semiconductor transistor 151.

A cross-sectional view in FIG. 6 illustrates the case in which the oxide semiconductor transistors 151 overlaps with a transistor that is formed using a semiconductor substrate and serves as the element that generates heat or the element included in a circuit that generates heat, so that these are close to each other.

In FIG. 6, the oxide semiconductor transistor 151 is formed over a transistor 211 formed using a semiconductor substrate 200. Note that either one or both of a p-channel transistor and an n-channel transistor may be provided over the semiconductor substrate 200.

A p-channel transistor and an n-channel transistor each of which is formed using the semiconductor substrate 200 may be formed by a general method. After a p-channel transistor and an n-channel transistor are formed using the semiconductor substrate 200, the oxide semiconductor transistor 151 is formed thereover.

Note that the semiconductor substrate 200 for which the p-channel transistor and the n-channel transistor are provided includes a high-concentration impurity region 201 functioning as a source region or a drain region, a low-concentration impurity region 202. Further, the p-channel transistor and the n-channel transistor include a gate insulating film 203, a gate electrode 204, and an interlayer insulating film 205.

An oxide semiconductor transistor 151 includes an oxide semiconductor film 181 provided over the semiconductor substrate 200 for which the p-channel transistor and the n-channel transistor are provided, electrodes 182a and 182b serving as a source electrode and a drain electrode which are in contact with the oxide semiconductor film 181 and provided apart from each other, a gate insulating film 183 provided over at least a channel formation region in the oxide semiconductor film 181, and a gate electrode 184 which overlaps with the oxide semiconductor film 181 and is provided over the gate insulating film 183.

The interlayer insulating film 205 also functions as a base insulating film of the oxide semiconductor film 181.

In this embodiment, as described above, an example in which the protective circuit 105 is used as the voltage converter circuit 102 that is a DC-DC converter is described; however, the present invention is not limited thereto. The protective circuit 105 in this embodiment can be used for a power source circuit including other circuits that generate large heat such as an AC-DC converter.

A plurality of protective circuits 105 may be arranged in matrix for an element that generates heat or a circuit that generates heat. When the plurality of protective circuits 105 are arranged in matrix, the plurality of protective circuits 105 serve as temperature sensors for measuring temperature distribution for the element that generates heat or the circuit that generates heat. With such a structure, a temperature sensor can be obtained.

[Embodiment 2]

In this embodiment, an oxide semiconductor transistor that is used for one embodiment of the disclosed invention is described in detail. Note that the oxide semiconductor transistor in this embodiment can be used as the oxide semiconductor transistor described in Embodiment 1.

An oxide semiconductor to be used for an oxide semiconductor transistor of this embodiment preferably contains at least indium (In) or zinc (Zn). It is particularly preferable that the oxide semiconductor contain In and Zn. As a stabilizer for reducing variation in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, for example, an In—Ga—Zn-based oxide means an oxide containing In, Ga, and Zn as its main component, and there is no particular limitation on the ratio of In, Ga, and Zn. Further, the In—Ga—Zn-based oxide may contain a metal element other than In, Ga, and Zn.

As the oxide semiconductor, a material expressed by a chemical formula $InMO_{3(ZnO)_m}$ (m>0 and m is not an integer) may be used. Note that M represents one or more metal elements selected from Ga, Fe, Mn, and Co. As the oxide semiconductor, a material expressed by $In_3SnO_5(ZnO)_n$ (n>0 and n is an integer) may also be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the present invention is not limited to the above compositions, and an oxide having an appropriate composition may be used depending on necessary semiconductor characteristics (e.g., mobility, a threshold voltage, or variation). In order to obtain necessary semiconductor characteristics, it is preferable that the carrier density, the impurity concentration, the defect density, the atomic ratio of a metal element to oxygen, the interatomic distance, the density, and the like of the oxide semiconductor be set to be appropriate.

For example, with an In—Sn—Zn-based oxide, high mobility can be obtained with relative ease. However, mobility can be increased by reducing the defect density in a bulk also in the case of using the In—Ga—Zn-based oxide.

Note that for example, the expression "the composition of an oxide containing In, Ga, and Zn at the atomic ratio, In:Ga:Zn=a:b:c (a+b+c =1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a crystalline portion or a non-amorphous structure.

In the case of an oxide semiconductor in an amorphous state, a flat surface can be obtained with relative ease, so that when a transistor is manufactured with the use of such an oxide semiconductor, interface scattering can be reduced, and relatively high mobility can be obtained with relative ease.

In an oxide semiconductor having crystallinity, defects in the bulk can be further reduced and when surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with an average surface roughness ($R_a$) of less than or equal to 1 nm, preferably less than or equal to 0.3 nm, further preferably less than or equal to 0.1 nm.

Note that the average surface roughness ($R_a$) is obtained by expanding, into three dimensions, centerline average roughness that is defined by JIS B 0601 to be able to apply it to a surface. $R_a$ can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \qquad \text{[FORMULA 1]}$$

In the above formula, $S_0$ represents the area of a plane to be measured (a rectangular region that is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

When an oxide semiconductor film of one embodiment of the disclosed invention has crystallinity, the above-described CAAC-OS may be used. A CAAC-OS is described hereinbelow.

In this embodiment, an oxide semiconductor including a crystal with c-axis alignment, which has a triangular or hexagonal atomic arrangement when seen from the direction of an a-b plane, a surface, or an interface is described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis). Such an oxide semiconductor is also referred to as a c-axis aligned crystalline oxide semiconductor (CAAC-OS).

In a broad sense, a CAAC-OS means a non-single-crystal oxide semiconductor including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC-OS is not a single crystal oxide semiconductor, but this does not mean that the CAAC-OS is composed of only an amorphous component. Although the CAAC-OS includes a crystallized portion (crystalline portion), a boundary between one crystalline portion and another crystalline portion is not clear in some cases.

Nitrogen may be substituted for part of oxygen included in the CAAC-OS. The c-axes of individual crystalline portions included in the CAAC-OS may be aligned in one direction (e.g., a direction perpendicular to a surface of a substrate over which the CAAC-OS is formed or a surface of the CAAC-OS). Alternatively, the normals of the a-b planes of the individual crystalline portions included in the CAAC-OS may be aligned in one direction (e.g., a direction perpendicular to a surface of a substrate over which the CAAC-OS is formed or a surface of the CAAC-OS).

The CAAC-OS becomes a conductor, a semiconductor, or an insulator depending on its composition or the like. The CAAC-OS transmits or does not transmit visible light depending on its composition or the like.

As an example of such a CAAC-OS, there is an oxide semiconductor that is formed into a film shape and has a triangular or hexagonal atomic arrangement when observed from the direction perpendicular to a surface of the film or a surface of a substrate over which the oxide semiconductor is formed, and in which metal atoms are arranged in a layered manner or metal atoms and oxygen atoms (or nitrogen atoms) are arranged in a layered manner when a cross section of the film is observed.

An example of a crystal structure of the CAAC-OS is described in detail with reference to FIGS. 7A to 7E, FIGS. 8A to 8C, and FIGS. 9A to 9C. In FIGS. 7A to 7E, FIGS. 8A to 8C, and FIGS. 9A to 9C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 7A to 7E, O surrounded by a circle represents tetracoordinate O and O surrounded by a double circle represents tricoordinate O.

Figure 7A:
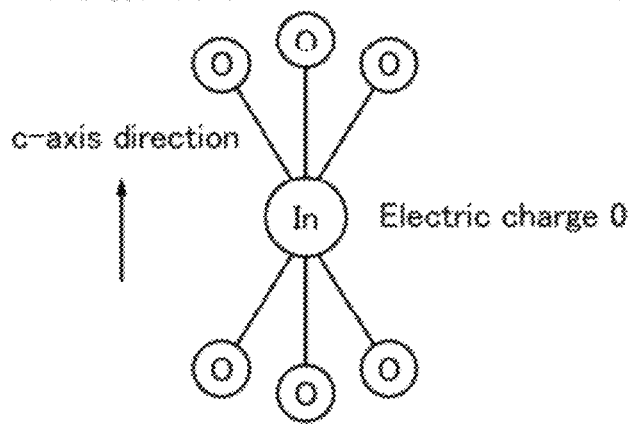
FIGS. 7A to 7E each illustrate a crystal structure of an oxide material.

FIG. 7A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 7A is actually an octahedral structure, but is illustrated as a planar structure for simplicity. Note that three tetracoordinate O atoms exist in each of an upper half and a lower half in FIG. 7A. In the small group illustrated in FIG. 7A, electric charge is 0.

Figure 7D:
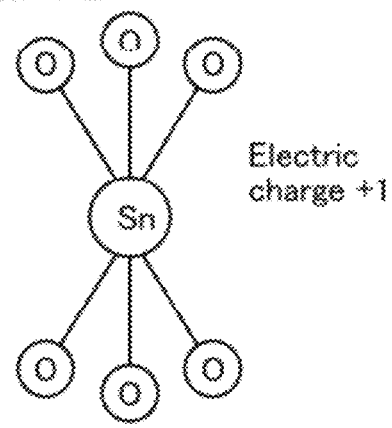
Figure 7B:
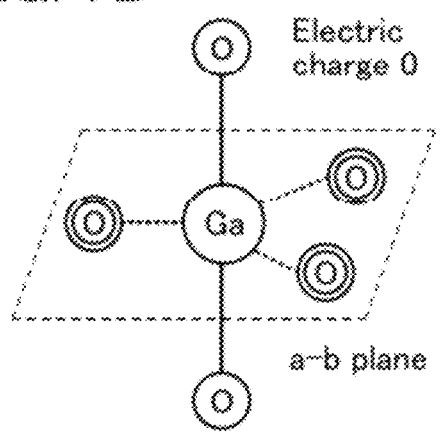

FIG. 7B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 7B. An In atom can also have the structure illustrated in FIG. 7B because an In atom can have five ligands. In the small group illustrated in FIG. 7B, electric charge is O.

Figure 7E:
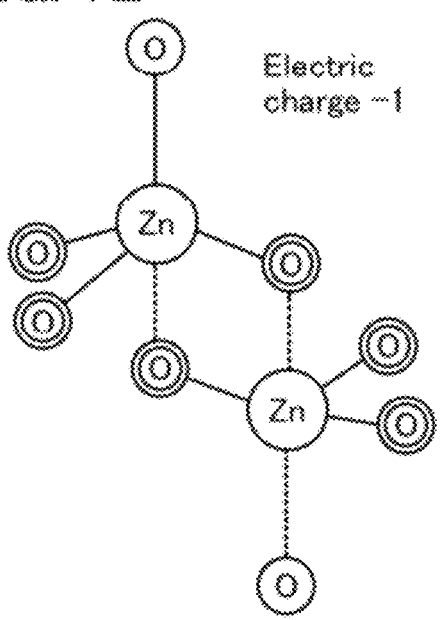
Figure 7C:
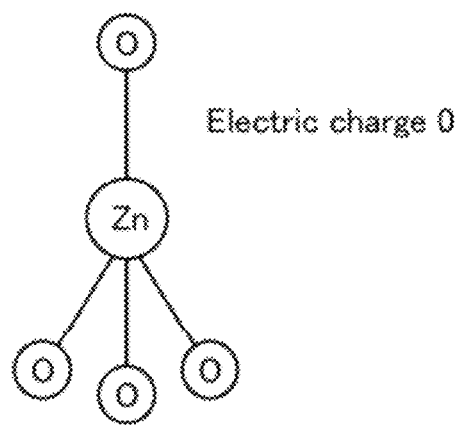

FIG. 7C illustrates a structure including one tetracoordinate Zn atom and four tetracoordinate O atoms proximate to the Zn atom. In FIG. 7C, one tetracoordinate O atom exists in an upper half and three tetracoordinate O atoms exist in a lower half In the small group illustrated in FIG. 7C, electric charge is 0.

FIG. 7D illustrates a structure including one hexacoordinate Sn atom and six tetracoordinate O atoms proximate to the Sn atom. In FIG. 7D, three tetracoordinate O atoms exist in each of an upper half and a lower half In the small group illustrated in FIG. 7D, electric charge is +1.

FIG. 7E illustrates a small group including two Zn atoms. In FIG. 7E, one tetracoordinate O atom exists in each of an upper half and a lower half In the small group illustrated in FIG. 7E, electric charge is −1.

Here, a plurality of small groups form a medium group, and a plurality of medium groups form a large group (also referred to as a unit cell).

Now, a rule of bonding between the small groups is described. The three O atoms in the upper half with respect to the In atom have three proximate In atoms in the downward direction, and the three O atoms in the lower half have three proximate In atoms in the upward direction. The one O atom in the upper half with respect to the Ga atom has one proximate Ga atom in the downward direction, and the one O atom in the lower half has one proximate Ga atom in the upward direction. The one O atom in the upper half with respect to the Zn atom has one proximate Zn atom in the downward direction, and the three O atoms in the lower half have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the upper half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 8A illustrates a model of a medium group included in a layered structure of an In—Sn—Zn—O-based material. FIG. 8B illustrates a large group including three medium groups. Note that FIG. 8C illustrates an atomic arrangement in the case where the layered structure in FIG. 8B is observed from the c-axis direction.

In FIG. 8A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 8A, one tetracoordinate O atom existing in each of an upper half and a lower half with respect to an In atom is denoted by circled 1. FIG. 8A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half In the medium group included in the layered structure of the In—Sn—Zn—O-based material in FIG. 8A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 7E can be given. For example, with one small group including two Zn atoms, electric charge of one small group including a Sn atom can be cancelled, so that the total electric charge of the layered structure can be 0.

Specifically, when the large group illustrated in FIG. 8B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_{7(ZnO)_m}$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a single-component metal oxide, such as an In-based oxide, a Sn-based oxide, or a Zn-based oxide; and the like.

Figure 9A:
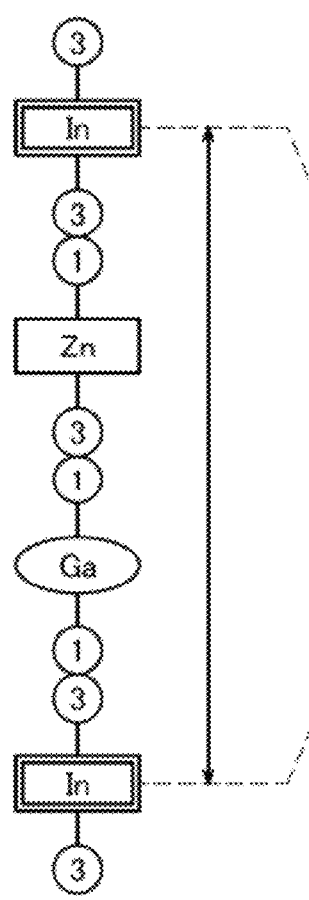
FIGS. 9A to 9C illustrate a crystal structure of an oxide material.

As an example, FIG. 9A illustrates a model of a medium group included in a layered structure of an In—Ga—Zn—O-based material.

In the medium group included in the layered structure of the In—Ga—Zn—O-based material in FIG. 9A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 9B:
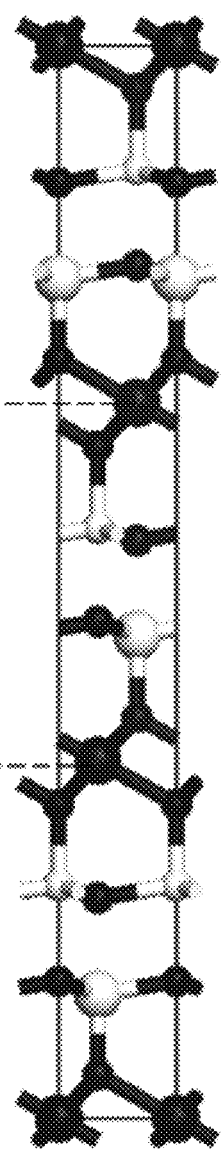
Figure 9C:
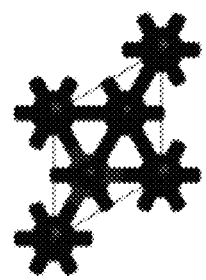

FIG. 9B illustrates a large group including three medium groups. Note that FIG. 9C illustrates an atomic arrangement in the case where the layered structure in FIG. 9B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 9A but also a medium group in which the arrangement of the In atom, the Ga atom, and the Zn atom is different from that in FIG. 9A.

Specifically, when the large group illustrated in FIG. 9B is repeated, an In—Ga—Zn—O-based material can be obtained. Note that a layered structure of the obtained In—Ga—Zn—O-based material can be expressed as a composition formula, $InGaO_3(ZnO)_n$ (n is a natural number).

Figure 10A:
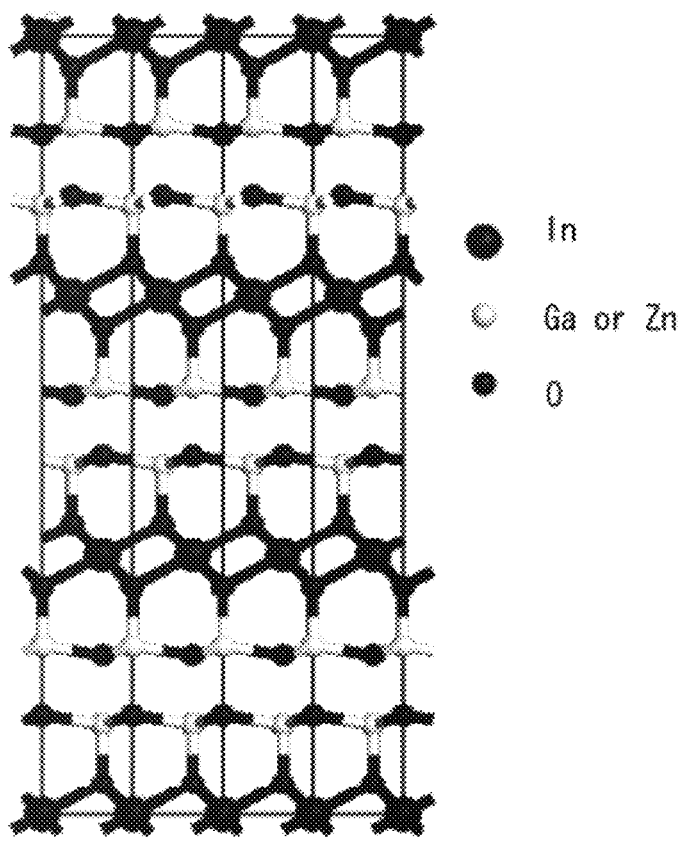
FIGS. 10A and 10B each illustrate a crystal structure of an oxide material.

In the case where n=1 ($InGaZnO_4$), a crystal structure illustrated in FIG. 10A can be obtained, for example. Note that in the crystal structure in FIG. 10A, a Ga atom and an In atom each have five ligands as described in FIG. 7B, a structure in which Ga is replaced with In can be obtained.

Figure 10B:
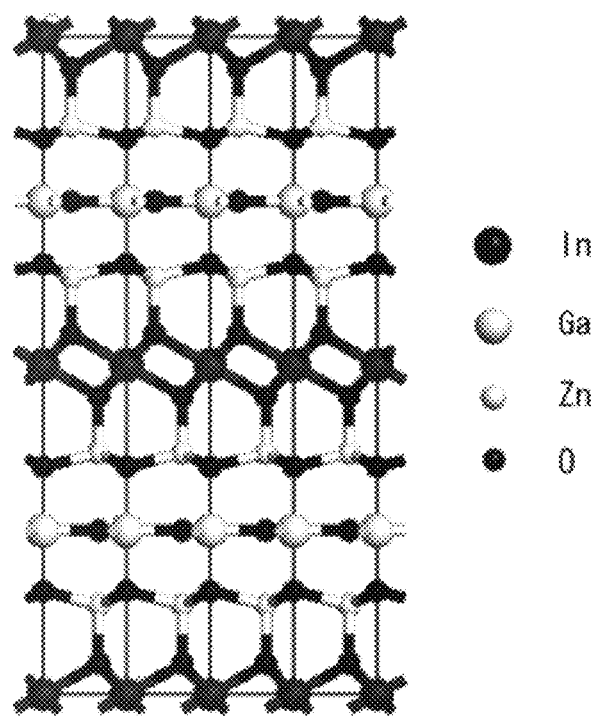

In the case where n=2 (InGaZn$_2$O$_5$), a crystal structure illustrated in FIG. 10B can be obtained, for example. Note that in the crystal structure in FIG. 10B, a Ga atom and an In atom each have five ligands as described in FIG. 7B, a structure in which Ga is replaced with In can be obtained.

In the case of forming a film of an In—Ga—Zn—O-based material as the oxide semiconductor film by a sputtering method, it is preferable to use an In—Ga—Zn—O target having the following atomic ratio: the atomic ratio of In:Ga:Zn is 1:1:1, 4:2:3, 3:1:2, 1:1:2, 2:1:3, or 3:1:4. When the oxide semiconductor film is formed using an In—Ga—Zn—O target having the above atomic ratio, a polycrystal oxide semiconductor or CAAC-OS is easily formed.

In the case of forming a film of an In—Sn—Zn—O based material as an oxide semiconductor film by a sputtering method, it is preferable to use an In—Sn—Zn—O target having an atomic ratio of In:Sn:Zn=1:1:1, 2:1:3, 1:2:2, or 20:45:35. When an oxide semiconductor film is formed using an In—Sn—Zn—O target having the aforementioned atomic ratio, a polycrystal oxide semiconductor or a CAAC-OS is easily formed.

An example of a transistor that includes an In—Sn—Zn—O film as an oxide semiconductor film is described with reference to FIGS. 11A and 11B and the like.

Figure 11A:
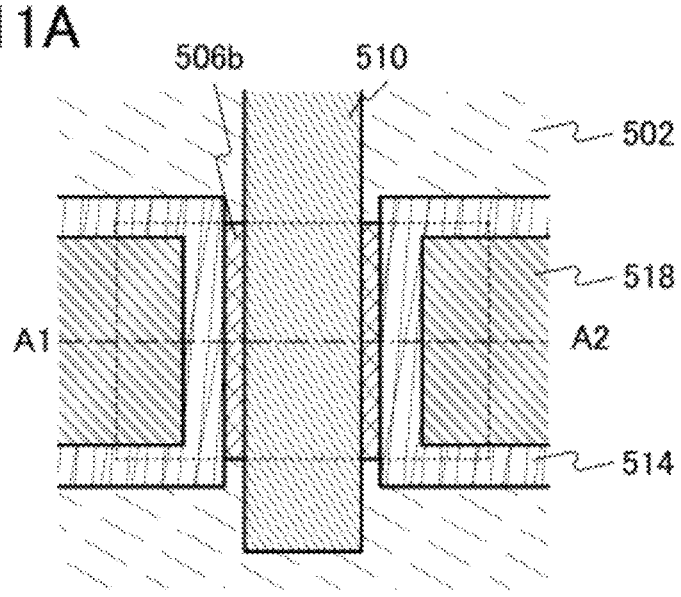
FIGS. 11A and 11B are a top view and a cross-sectional view, respectively, of a semiconductor device.
Figure 11B:
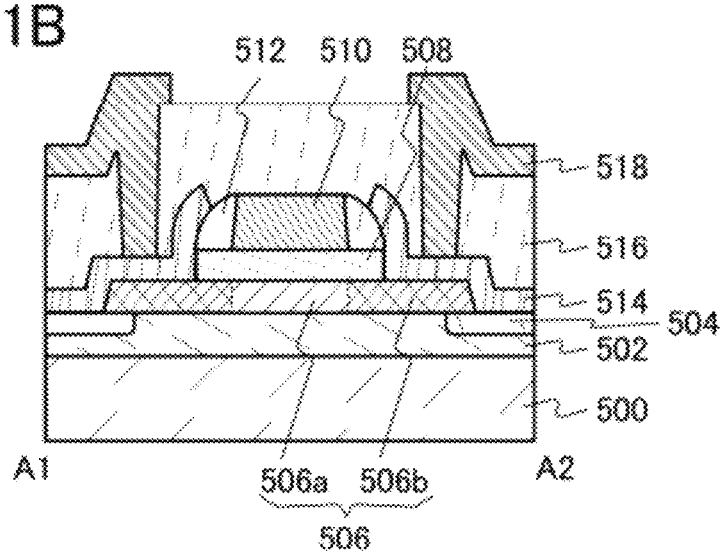

FIGS. 11A and 11B illustrate a coplanar transistor having a top-gate top-contact structure. FIG. 11A is a top view of the transistor. FIG. 11B is a cross-sectional view along dashed-dotted line A1-A2 in FIG. 11A.

The transistor illustrated in FIG. 11B includes a substrate 500; a base insulating film 502 provided over the substrate 500; a protective insulating film 504 provided in the periphery of the base insulating film 502; an oxide semiconductor film 506 provided over the base insulating film 502 and the protective insulating film 504 and including a high-resistance region 506a and low-resistance regions 506b; a gate insulating film 508 provided over the oxide semiconductor film 506; a gate electrode 510 provided to overlap with the oxide semiconductor film 506 with the gate insulating film 508 positioned therebetween; a sidewall insulating film 512 provided in contact with a side surface of the gate electrode 510; a pair of electrodes 514 provided in contact with at least the low-resistance regions 506b; an interlayer insulating film 516 provided to cover at least the oxide semiconductor film 506, the gate electrode 510, and the pair of electrodes 514; and a wiring 518 provided to be connected to at least one of the pair of electrodes 514 through an opening formed in the interlayer insulating film 516.

Although not illustrated, a protective film may be provided to cover the interlayer insulating film 516 and the wiring 518. With the protective film, a minute amount of a leakage current generated by surface conduction of the interlayer insulating film 516 can be reduced and thus the off-state current of the transistor can be reduced.

Another example of a transistor that includes an In—Sn—Zn—O film as an oxide semiconductor film is described.

Figure 12A:
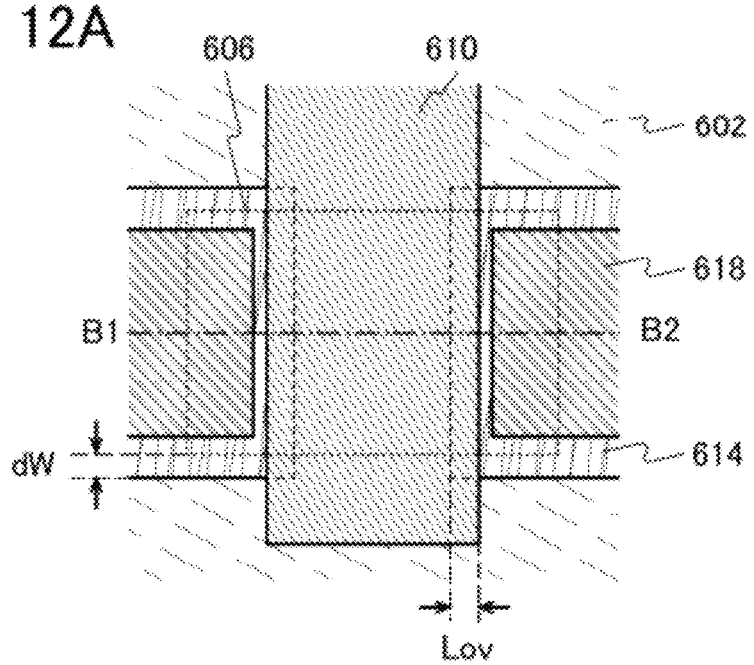
FIGS. 12A and 12B are a top view and a cross-sectional view, respectively, of a semiconductor device.
Figure 12B:
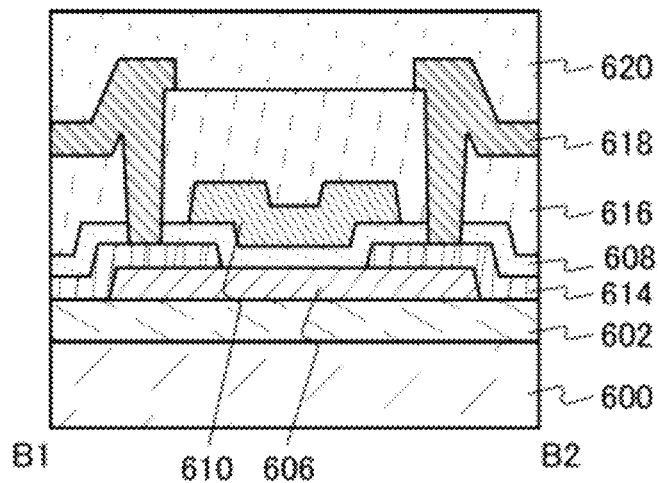

FIGS. 12A and 12B illustrate the structure of a transistor manufactured in this embodiment. FIG. 12A is the top view of the transistor. FIG. 12B is the cross-sectional view along dashed-dotted line B1-B2 in FIG. 12A.

The transistor illustrated in FIG. 12B includes a substrate 600; a base insulating film 602 provided over the substrate 600; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 positioned therebetween; an interlayer insulating film 616 provided to cover the gate insulating film 608 and the gate electrode 610; wirings 618 connected to the pair of electrodes 614 through openings formed in the interlayer insulating film 616; and a protective film 620 provided to cover the interlayer insulating film 616 and the wirings 618.

As the substrate 600, a glass substrate is used. As the base insulating film 602, a silicon oxide film is used. As the oxide semiconductor film 606, an In—Sn—Zn—O film is used. As the pair of electrodes 614, a tungsten film is used. As the gate insulating film 608, a silicon oxide film is used. The gate electrode 610 has a stacked structure of a tantalum nitride film and a tungsten film. The interlayer insulating film 616 has a stacked structure of a silicon oxynitride film and a polyimide film. The wirings 618 each have a stacked structure in which a titanium film, an aluminum film, and a titanium film are formed in this order. As the protective film 620, a polyimide film is used.

Note that in the transistor having the structure illustrated in FIG. 12A, the width of a portion where the gate electrode 610 overlaps with one of the pair of electrodes 614 is referred to as $L_{ov}$. Similarly, the width of a portion of the pair of electrodes 614, which does not overlap with the oxide semiconductor film 606, is referred to as $_dW$.

This embodiment can be combined with any of the above embodiments.

This application is based on Japanese Patent Application serial No. 2011-112139 filed with Japan Patent Office on May 19, 2011, the entire contents of which are hereby incorporated by reference.

What is claimed is:

1. A circuit comprising:
 a voltage converter circuit comprising a third transistor; and
 a control circuit comprising:
  an error amplifier;
  a pulse width modulation output driver, an input terminal of the pulse width modulation output driver being electrically connected to an output terminal of the error amplifier, and an output terminal of the pulse width modulation output driver being electrically connected to a gate of the third transistor; and
  a protective circuit, the protective circuit comprising:
   a first transistor comprising an oxide semiconductor layer in a channel region;
   a capacitor;
   a second transistor comprising an oxide semiconductor layer in a channel region; and
   an operational amplifier comprising a non-inverting input terminal to which a reference voltage is input,
 wherein one of a source and a drain of the first transistor is electrically connected to a terminal of the capacitor, one of a source and a drain of the second transistor, and an inverting input terminal of the operational amplifier, and
 wherein an element that generates heat in the voltage converter circuit or the control circuit is detected by the first transistor adjacent to the element.

2. The circuit according to claim 1, wherein an off-state current of the first transistor increases as an increase of a temperature of the first transistor.

3. The circuit according to claim 2, wherein the capacitor is configured to accumulate the off-state current of the first transistor as an electric charge.

4. The circuit according to claim 1, wherein the first transistor and the element are arranged in a multi-finger layout or a common-centroid layout.

5. The circuit according to claim 1, further comprising a voltage divider circuit electrically connected to the voltage converter circuit.

6. The circuit according to claim 1, wherein the control circuit further comprises:
a voltage regulator circuit electrically connected to the other of the source and the drain of the first transistor, the voltage regulator circuit being configured to adjust an output voltage;
a bias generation circuit electrically connected to the voltage regulator circuit, the bias generation circuit being configured to be applied a bias voltage or a bias current;
a reference voltage generation circuit electrically connected to the voltage regulator circuit, the reference voltage generation circuit being configured to generate a second reference voltage; and
a band gap reference electrically connected to the voltage regulator circuit, the band gap reference being configured to generate a third reference voltage.

7. The circuit according to claim 1, wherein the voltage converter circuit is a DC-DC converter.

8. The circuit according to claim 1, wherein the voltage converter circuit is an AC-DC converter.

9. A circuit comprising:
a voltage converter circuit comprising a third transistor;
an error amplifier;
a pulse width modulation output driver, an input terminal of the pulse width modulation output driver being electrically connected to an output terminal of the error amplifier, and an output terminal of the pulse width modulation output driver being electrically connected to a gate of the third transistor;
a first transistor comprising an oxide semiconductor layer in a channel region;
a capacitor; and
an operational amplifier comprising a non-inverting input terminal to which a reference voltage is input,
wherein one of a source and a drain of the first transistor is electrically connected to a terminal of the capacitor and an inverting input terminal of the operational amplifier, and
wherein the capacitor is configured to accumulate an off-state current of the first transistor as an electric charge so that the accumulated voltage is input to the inverting input terminal.

10. The circuit according to claim 9, wherein the off-state current of the first transistor increases as an increase of a temperature of the first transistor.

11. The circuit according to claim 9, further comprising a second transistor comprising an oxide semiconductor layer in a channel region,
wherein one of a source and a drain of the second transistor is electrically connected to the terminal of the capacitor.

12. The circuit according to claim 9,
wherein the voltage converter circuit comprises an element, and
wherein the element is adjacent to the first transistor.

13. The circuit according to claim 12, wherein the first transistor and the element are arranged in a multi-finger layout or a common-centroid layout.

14. The circuit according to claim 9, wherein the voltage converter circuit is a DC-DC converter.

15. The circuit according to claim 9, wherein the voltage converter circuit is an AC-DC converter.

16. A circuit comprising:
a voltage converter circuit comprising a third transistor;
an error amplifier;
a pulse width modulation output driver, an input terminal of the pulse width modulation output driver being electrically connected to an output terminal of the error amplifier, and an output terminal of the pulse width modulation output driver being electrically connected to a gate of the third transistor;
a first transistor comprising an oxide semiconductor layer in a channel region;
a capacitor;
a second transistor comprising an oxide semiconductor layer in a channel region; and
an operational amplifier comprising a non-inverting input terminal to which a reference voltage is input,
wherein one of a source and a drain of the first transistor is electrically connected to a terminal of the capacitor, one of a source and a drain of the second transistor, and an inverting input terminal of the operational amplifier,
wherein a ground potential is input to the other of the source and the drain of the second transistor,
wherein the capacitor is configured to accumulate an off-state current of the first transistor as an electric charge, and
wherein the second transistor is capable of releasing the electric charge accumulated in the capacitor.

17. The circuit according to claim 16, wherein the off-state current of the first transistor increases as an increase of a temperature of the first transistor.

18. The circuit according to claim 16,
wherein the voltage converter circuit comprises an element, and
wherein the element is adjacent to the first transistor.

19. The circuit according to claim 18, wherein the first transistor and the element are arranged in a multi-finger layout or a common-centroid layout.

20. The circuit according to claim 16, wherein the voltage converter circuit is a DC-DC converter.

21. The circuit according to claim 16, wherein the voltage converter circuit is an AC-DC converter.

22. The circuit according to claim 1, wherein the oxide semiconductor layer of each of the first transistor and the second transistor comprises at least one of indium and zinc.

23. The circuit according to claim 1, wherein a channel width of the first transistor is larger than a channel width of the second transistor.

24. The circuit according to claim 1, wherein a voltage input to a gate of the first transistor is lower than or equal to 0V.

25. The circuit according to claim 9, wherein the oxide semiconductor layer of the first transistor comprises at least one of indium and zinc.

26. The circuit according to claim 9, wherein a voltage input to a gate of the first transistor is lower than or equal to 0V.

27. The circuit according to claim 16, wherein the oxide semiconductor layer of each of the first transistor and the second transistor comprises at least one of indium and zinc.

28. The circuit according to claim 16, wherein a channel width of the first transistor is larger than a channel width of the second transistor.

29. The circuit according to claim 16, wherein a voltage input to a gate of the first transistor is lower than or equal to 0V.

* * * * *